(12) United States Patent  (10) Patent No.: US 7,257,382 B2
Arai et al.  (45) Date of Patent: Aug. 14, 2007

(54) HIGH FREQUENCY AMPLIFIER CIRCUIT PERMITTING VARIABLE GAIN CONTROL

(75) Inventors: Tomoyuki Arai, Kawasaki (JP); David Enright, Dreieich-Buchschlag (DE)

(73) Assignee: Fujitsu Limited, Kawasaki (JP)

( * ) Notice: Subject to any disclaimer, the term of this patent is extended or adjusted under 35 U.S.C. 154(b) by 342 days.

(21) Appl. No.: 10/896,858

(22) Filed: Jul. 23, 2004

(65) Prior Publication Data
US 2005/0118971 A1  Jun. 2, 2005

(30) Foreign Application Priority Data
Nov. 27, 2003  (JP) ............................ 2003-396725

(51) Int. Cl.
*H01Q 11/12* (2006.01)
*H04B 1/04* (2006.01)

(52) U.S. Cl. .................... 455/91; 455/127.3; 330/254; 330/278

(58) Field of Classification Search .. 455/114.1–114.2, 455/127.2, 127.3, 249.1, 333; 330/254, 261, 330/278, 298, 133, 136, 129, 131
See application file for complete search history.

(56) References Cited

U.S. PATENT DOCUMENTS

| 4,468,749 | A | * | 8/1984 | Kato et al. | 327/337 |
|---|---|---|---|---|---|
| 4,555,668 | A | * | 11/1985 | Gregorian et al. | 330/9 |
| 5,872,475 | A | * | 2/1999 | Otaka | 327/308 |
| 6,288,669 | B1 | * | 9/2001 | Gata | 341/172 |
| 6,535,065 | B2 | * | 3/2003 | Aoki | 330/284 |
| 7,071,782 | B2 | * | 7/2006 | Delpy | 330/284 |
| 2004/0080372 | A1 | * | 4/2004 | Chen | 330/311 |
| 2006/0033574 | A1 | * | 2/2006 | Kim et al. | 330/284 |

FOREIGN PATENT DOCUMENTS

JP  08-288791  11/1996

* cited by examiner

*Primary Examiner*—Simon Nguyen
(74) *Attorney, Agent, or Firm*—Arent Fox LLP

(57) ABSTRACT

The present invention is an amplifier circuit that permits variable gain control, comprising an input terminal to which a high frequency input signal is supplied; an amplifier transistor to the gate of which the high frequency input signal supplied to the input terminal is supplied and which generates an amplified signal at the drain side; and a variable attenuator provided in a signal transmission line between the input terminal and the gate of the amplifier transistor, in which a plurality of attenuation units in which an attenuation capacitor and a switch transistor are serially connected are provided in parallel between the signal transmission line and a power supply, and the attenuation ratio of which is variably controlled by controlling the conduction of the switch transistor.

13 Claims, 6 Drawing Sheets

EMBODIMENT (1)

FIG. 1   ORDINARY HIGH FREQUENCY CIRCUIT

HIGH FREQUENCY AMPLIFIER CIRCUIT PERMITTING VARIABLE GAIN CONTROL

BACKGROUND OF THE INVENTION

1. Field of the Invention

The present invention relates to a high frequency amplifier circuit that permits variable gain control, and, more particularly, a high frequency amplifier circuit that prevents noise figure degradation while retaining gain linearity and allows the number of elements to be reduced.

2. Description of the Related Art

The implementation of a high frequency circuit by means of a silicon or compound semiconductor chip has been proposed. More particularly, as cellular phones, portable information terminals, and so forth, have become widespread, the development of low-cost silicon chips mounted with high frequency circuits that can be employed in microwave bands such as 2 to 40 GHz, for example, has progressed.

Variable gain power amplifiers are employed in various places in high frequency circuits. However, in order to implement such a power amplifier in a silicon chip, the need for noise figure (NF) degradation suppression, a linear gain characteristic, a reduction in the number of elements, and so forth, must be satisfied.

FIG. 1 shows a constitutional example of a general high frequency circuit. The output F1 of the high frequency circuit 10 that performs predetermined processing on a high frequency signal F0 is input, via a matching circuit 12, to an amplifier circuit 14 capable of gain control. A signal Fout, which is amplified with the gain controlled by means of a gain control signal GCNT, is then outputted. The matching circuit 12 is a circuit for impedance-matching the output F1 of the high frequency circuit 10 such that the output F1 is optimized in accordance with the relationship between the high frequency circuit 10 and the amplifier circuit 14, whereby reflection of the high frequency signal is prevented.

FIG. 2 is a circuit diagram showing a conventional example of a gain control amplifier circuit. In this conventional example, a variable attenuator 16 is provided upstream of an amplifier circuit 18 that comprises N-channel transistors Q30 and Q31 such that the amplitude of the input F2 from the matching circuit 12 is variably attenuated by the variable attenuator 16, thereby controlling the gain of the amplifier overall. A first bias voltage Vbias1 is connected via a resistor R1 to the gate of the transistor Q31 and a second bias voltage Vbias2 is connected via a resistor R2 to the gate of the transistor Q30, such that the gain of the amplifier circuit 18 remains fixed. The variable attenuator 16 is constituted by a plurality of pie-shaped attenuation circuits 20 and 22 that are each constituted by respective resistive elements R1 to R3 and R4 to R6 respectively, such that the attenuation amount can be variably controlled by the switches SW11 and SW12. Switches SW11 and SW12 are each formed by a switch that is constituted by an N-channel transistor, for example. When switches SW11 and SW12 are both connected to attenuation circuit 20, the signal is attenuated at the attenuation rate of attenuation circuit 20. When SW11 and SW12 are both connected to the attenuation circuit 22, the signal is attenuated at the attenuation rate of the attenuation circuit 22.

An attenuator provided upstream of the amplifier circuit as mentioned above is also disclosed by Japanese Patent Application Laid Open No. H8-288791, for example.

In the attenuator-equipped amplifier circuit shown in FIG. 2, a high frequency input signal F2 is attenuated by the attenuator 16 at the attenuation rate of the attenuation circuit 20, 22 selected by the switches SW11 and SW12 before being supplied to the gate of the transistor Q30 of the amplifier circuit 18 and then amplified with fixed gain. Therefore, the attenuation rate of the attenuator can be controlled linearly by performing control by means of the switches SW11 and SW12, and, as a result, the input signal F2 can be amplified with linear gain.

However, when the amplifier circuit shown in FIG. 2 is used in a low frequency band, the resistive elements of the pie-shaped attenuation circuits become a source of noise for the high frequency signal F2 in a high frequency band, such as 2 to 40 GHz, for example, and hence the noise figure (NF), which is the ratio between the input SN ratio and output SN ratio, deteriorates. Further, when resistive elements are formed on a silicon substrate, an impurity region is generally formed in the silicon substrate surface. However, a parasitic capacitance between the silicon substrate and the impurity region affects high frequency signals, which brings about degradation of the high frequency characteristic. In addition, switches SW1 and SW12 are provided in the transmission channel of the high frequency signal and therefore the characteristics of the transistor constituting these switches possess process dependency and so forth, which has an adverse effect on the linearity of the attenuator. Further, as shown in FIG. 2, the matching circuit 12 must be provided upstream of the attenuator 16 and brings about an increase in the number of elements.

SUMMARY OF THE INVENTION

An object of the present invention is accordingly to provide an amplifier circuit in which noise figure degradation with respect to a high frequency signal is small and which has a linear variable gain characteristic.

A further object of the present invention is to provide an amplifier circuit in which an attenuator with a linear attenuation characteristic is provided upstream.

It is yet another object of the present invention to provide a high frequency variable attenuator with a linear attenuation characteristic.

In order to achieve the above object, a first aspect of the present invention is an amplifier circuit that permits variable gain control, comprising an input terminal to which a high frequency input signal is supplied; an amplifier transistor to the gate of which the high frequency input signal supplied to the input terminal is supplied and which generates an amplified signal at the drain side; and a variable attenuator provided in a signal transmission line between the input terminal and the gate of the amplifier transistor, in which a plurality of attenuation units in which an attenuation capacitor and a switch transistor are serially connected are provided in parallel between the signal transmission line and a power supply, and the attenuation ratio of which is variably controlled by controlling the conduction of the switch transistor.

In order to achieve the above object, a second aspect of the present invention is a variable attenuator for attenuating a high frequency input signal, comprising: an input terminal to which the high frequency input signal is supplied; an output terminal that outputs a high frequency output signal; and an attenuation unit provided to a signal transmission line between the input and output terminals in which an attenuation capacitor and a switch transistor are serially connected between the signal transmission line and a power supply, wherein a plurality of the attenuation unit is provided in parallel and the attenuation ratio is variably controlled by controlling the conduction of the switch transistor.

According to the variable attenuator above, resistive elements and switches are not inserted in the transmission line of the high frequency input signal between the input terminal and the gate of the amplifier transistor, meaning that there is no problem with noise figure degradation or parasitic capacitance or the like caused by resistive elements and no degradation of the high frequency characteristic of the switch. It is therefore possible to provide an amplifier circuit that possesses a linear variable gain characteristic in which noise figure degradation with respect to a high frequency signal is small.

DESCRIPTION OF THE PREFERRED EMBODIMENTS

An embodiment of the present invention will be described hereinbelow with reference to the drawings. However, the technical scope of the present invention is not limited to or by this embodiment and is intended to cover the items appearing in the claims as well as any equivalents thereof.

Figure 2:
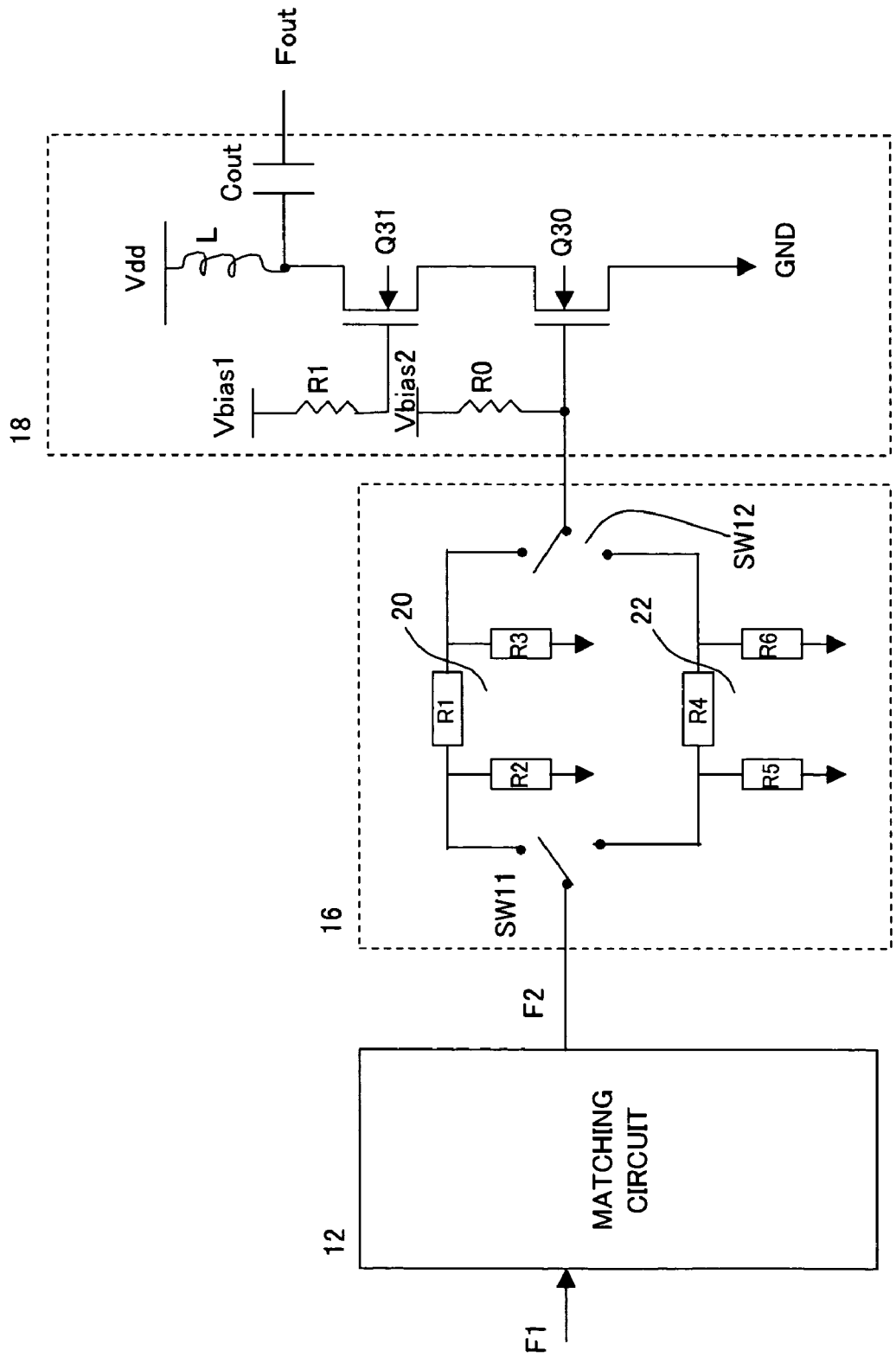
FIG. 2 is a circuit diagram showing a conventional example of a gain control amplifier circuit.
Figure 3:
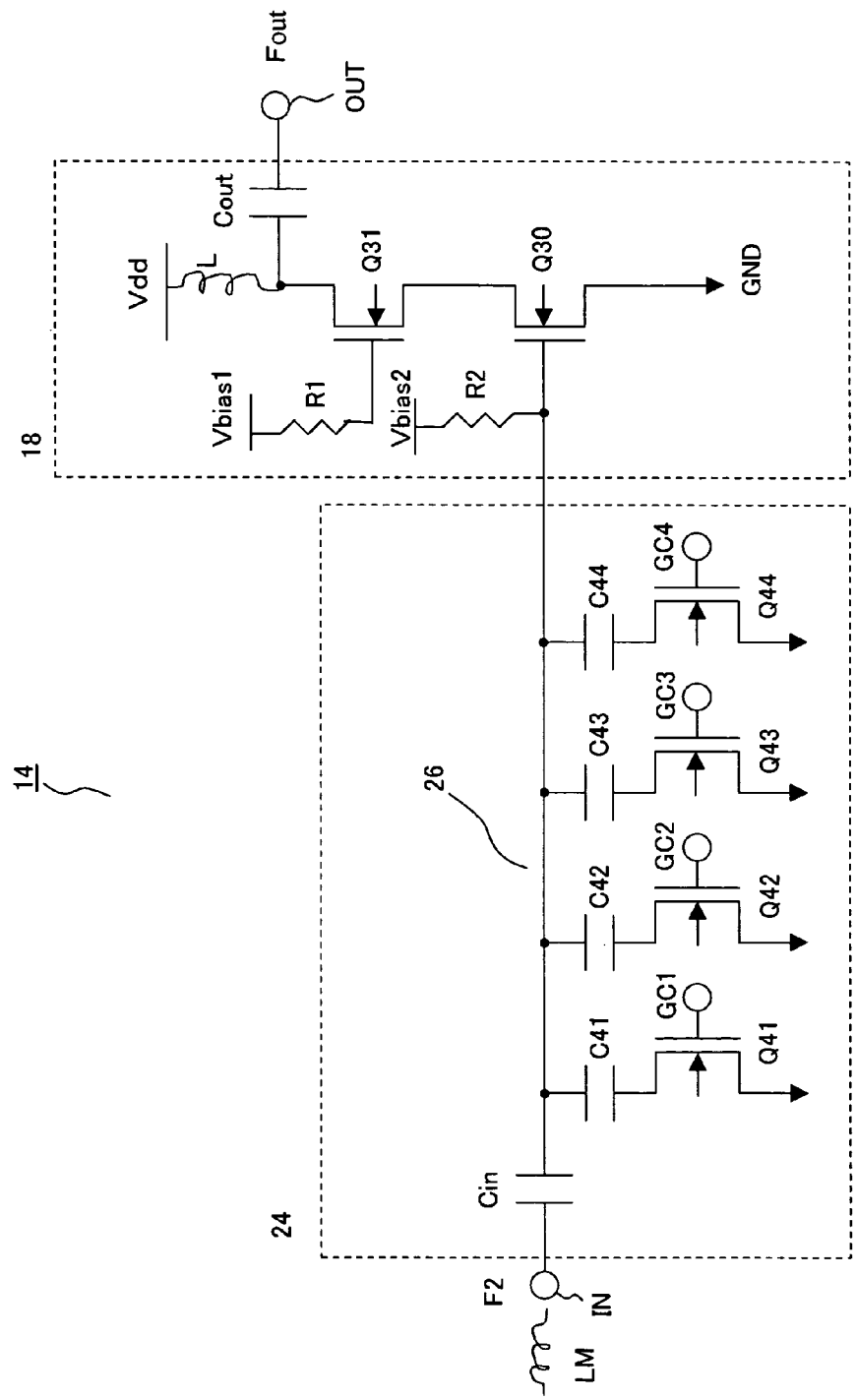
FIG. 3 is a circuit diagram of the amplifier circuit of this embodiment.

FIG. 3 is a circuit diagram of the amplifier circuit of this embodiment. In this amplifier circuit, a variable attenuator 24 is provided upstream of an amplifier transistor unit 18. The constitution of the amplifier transistor unit 18 is the same as the example in FIG. 2 and therefore the same reference numbers have been assigned. This amplifier circuit is constituted by MOS transistors Q30, Q31, capacitive element Cout, resistive element R1, R2, and inductance element L, and so forth, which are provided on a silicon substrate.

The amplifier transistor unit 18 is provided with an N-channel transistor Q30 whose gate is supplied with the high frequency input signal F2 from the input terminal IN and whose source is grounded, which constitutes an amplifier transistor. A second bias voltage Vbias2 is supplied via resistor R2 to the gate of the transistor Q30. Further, an N channel transistor Q31, to the gate of which the first bias voltage Vbias1 is supplied via the resistor R1, is provided on the drain side of the transistor Q30. Further, the drain of the transistor Q31 is connected to a power supply Vdd via a load inductance L. An output signal Fout is outputted from the drain of the transistor Q31 to the output terminal OUT via an output coupling capacitor Cout.

The amplifier transistor Q30 amplifies the input signal F2 supplied to the gate thereof and thus generates an amplified signal at the drain thereof. In addition, the transistor Q31, which is cascode-connected to the transistor Q30, further amplifies the amplified signal across the gate and source and generates the output signal Fout at the drain terminal. A higher gain can thus be provided by cascode-connecting the transistors Q30 and Q31.

The amplifier circuit of this embodiment is such that a variable attenuator 24 is provided between the gate of the amplifier transistor Q30 of the amplification unit 18, and the input terminal IN. By variably controlling the attenuation amount of the variable attenuator 24, the gain of the amplification circuit is variably controlled.

With regard to the attenuator 24, a plurality of attenuation units in which attenuation capacitors C41 to C44 and switch transistors Q41 to Q44 are serially connected are provided in parallel in a signal transmission line 26 between the input terminal IN and the gate of the transistor Q30. In the example in FIG. 3, four attenuation units are provided in parallel between the signal transmission line 26 and a ground supply GND. Further, attenuation amount control signals GC1 to GC4 are supplied to the gates of each of the switch transistors Q41 to Q44 to control same to conductive or nonconductive state.

The high frequency input signal F2 supplied to the input terminal IN is supplied to the gate of the amplifier transistor Q30 via the input coupling capacitor Cin and signal transmission line 26. Suppose that, when the attenuation amount control signal GC1 is controlled to the H level such that the transistor Q41 is then in a conductive state, some of the energy of the high frequency signal propagating on the signal transmission line 26 is absorbed by the ground supply GND via the attenuation capacitor C41 and the transistor Q41. That is, the attenuation capacitor C41 has a function to short the AC component of the high frequency signal to ground GND and the amount of energy absorbed is determined in accordance with the capacitance value of the attenuation capacitor C41. By controlling other transistors to be conductive so as to increase the number of attenuation capacitors, the amount of absorbed energy increases and, as a result, control is implemented such that the amount of attenuation increases.

Therefore, the capacitance values of the attenuation capacitors C41 to C44 are designed to increase in binary form as 1:2:4:8 and so forth and, the gate width of the switch transistors Q41 to Q44 are also designed to the same ratio, so that by suitably combining the attenuation amount control signals GC1 to GC4, the attenuation amount of the attenuator 24 can be increased linearly. That is, control is implemented such that, with all the transistors Q41 to Q44 in the non-conductive state, the attenuation amount is zero and the attenuation amount is controlled to increase linearly by combining the conductive states of the transistors Q41 to Q44. Therefore, the amplitude of the inputted high frequency input signal can be variably attenuated linearly by the attenuator 24 and then amplified with a fixed gain in the amplifier transistor unit 18. As a result, the gain of the whole amplifier circuit is variably controlled in linear fashion. Moreover, in the amplifier transistor unit 18, the gain is increased by using the two cascode-connected transistors Q30 and Q31 and hence the range of the variable gain control can be extended.

In this attenuator 24, resistive elements, switching transistors, and so forth need not be provided in the transmission line 26 for the high frequency signal. Therefore, the problems of noise-figure degradation, high frequency characteristic degradation, and so forth of the conventional example shown in FIG. 2 do not exist. Further, the problem of the adverse effect on the high frequency characteristic caused by the parasitic capacitance of the resistive elements no longer exists.

Figure 1:
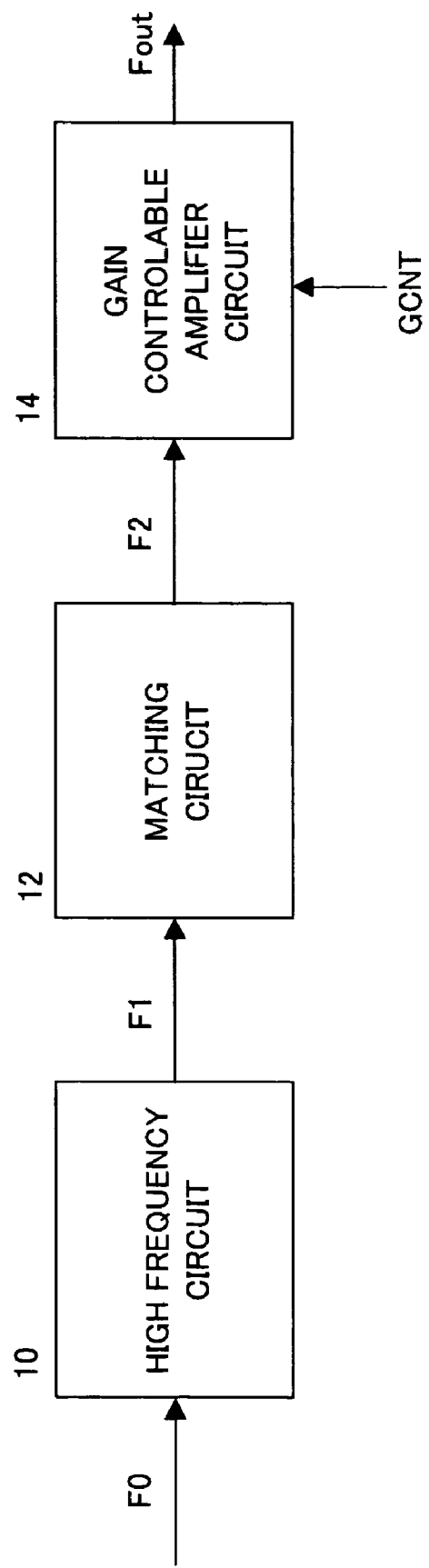
FIG. 1 shows a constitutional example of a general high frequency circuit.

Furthermore, depending on the constitution of the high frequency circuit 10 (See FIG. 1) provided upstream, it is sometimes necessary to provide the matching circuit 12 for impedance matching of some kind. However, the variable attenuator 24 of this embodiment comprises attenuation capacitors C41 to C44. Therefore, the required matching circuit can be constituted simply by adding an element such as an inductance element Lm upstream of the input terminal IN in addition to these attenuation capacitors. In this case, there is no need to newly provide a matching circuit, meaning that an increase in the number of elements can be suppressed. In addition, minute resistive elements may be provided as additional elements for the matching circuit. As long as minute resistive elements are provided, the accompanying noise figure degradation can be kept to a minimum.

An example of the capacitance values of the attenuation capacitors and input coupling capacitor in the variable attenuator 24 of this embodiment is as follows:

C41=280 fF, C42=560 fF, C43=1120fF, C44=2240 fF, and Cin=1120 fF

In addition, the gate length of the switch transistor is Lg=0.24 μm, for example, and the gate widths are as follows, for example:

Wg of Q41=8 μm, Wg of Q42=16 μm, Wg of Q43=32 μm, and Wg of Q44=64 μm.

According to the above example, the attenuation amount can be controlled in 4 bits by switching the attenuation amount control signals. Further, by establishing quite a large coupling capacitor Cin, and suitably providing an inductance element or the like upstream of the input terminal IN, even when the number of attenuation capacitors C41 to C44 is changed by performing suitable conduction control for the switching transistors Q41 to Q44, a variation in the input impedance from the upstream high frequency circuit can be suppressed and impedance matching can be maintained within a wide frequency range.

Figure 4:
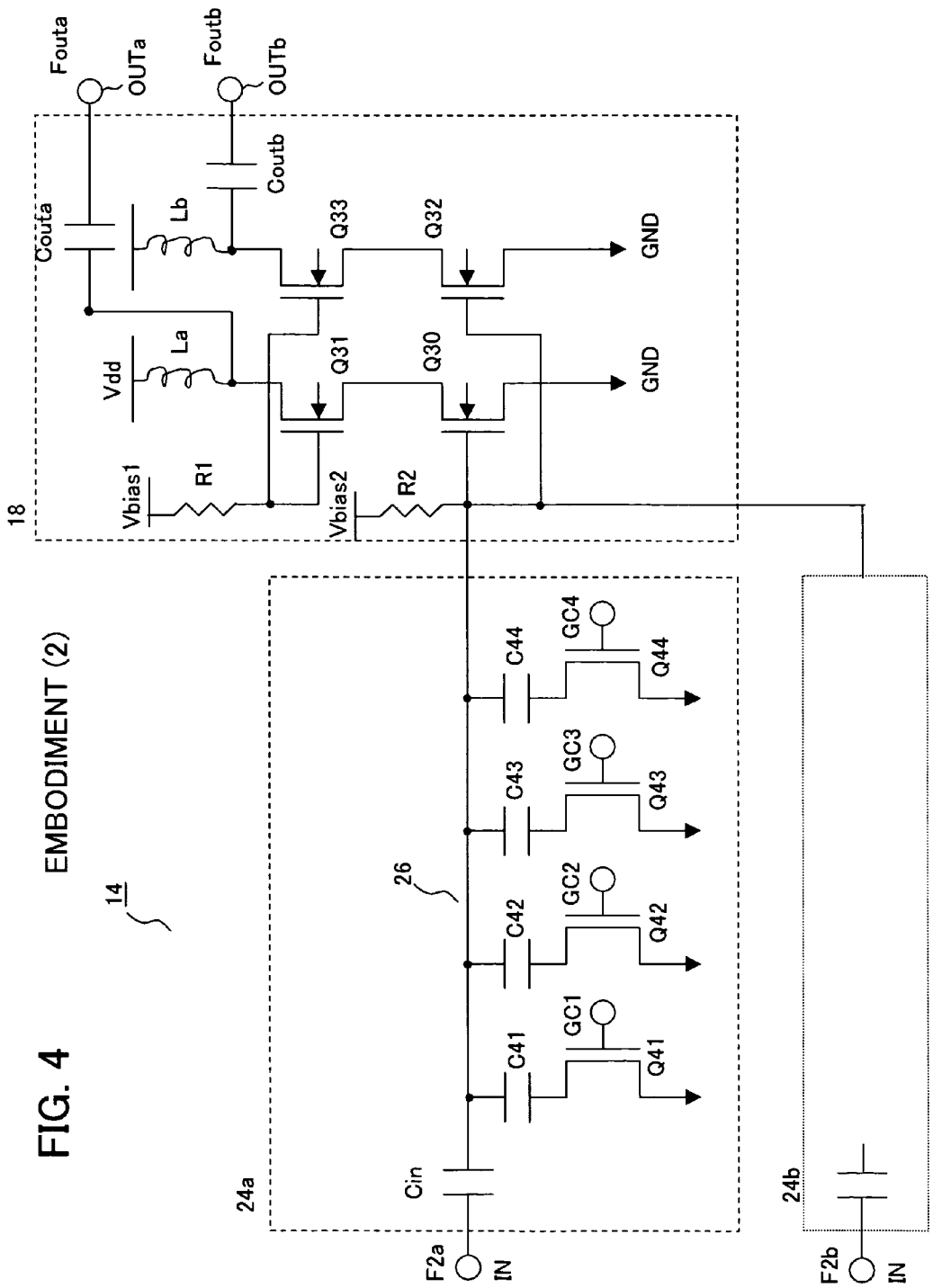
FIG. 4 is a circuit diagram of a first modified example of the amplifier circuit of this embodiment.

FIG. 4 is a circuit diagram of the first modified example of the amplifier circuit of this embodiment. According to this modified example, the amplifier transistor unit 18 is such that amplifier transistors Q32 and Q33 are also added in parallel with the amplifier transistors Q30 and Q31. The circuit of the amplifier transistor unit 18 shown in FIG. 3 is a single-layer circuit in which the two transistors Q30 and Q31 are cascode-connected, whereas the circuit of the amplifier transistor unit 18 in FIG. 4 is a differential circuit in which cascode-connected transistors are provided in parallel. Further, differential input signals F2a and F2b are inputted to the gates of the amplifier transistors Q30 and Q32 via respective attenuators 24a and 24b for these signals F2a and F2b and thus amplified, whereby differential output signals Fouta and Foutb are outputted. The noise characteristic can be improved by providing this differential circuit.

Figure 5:
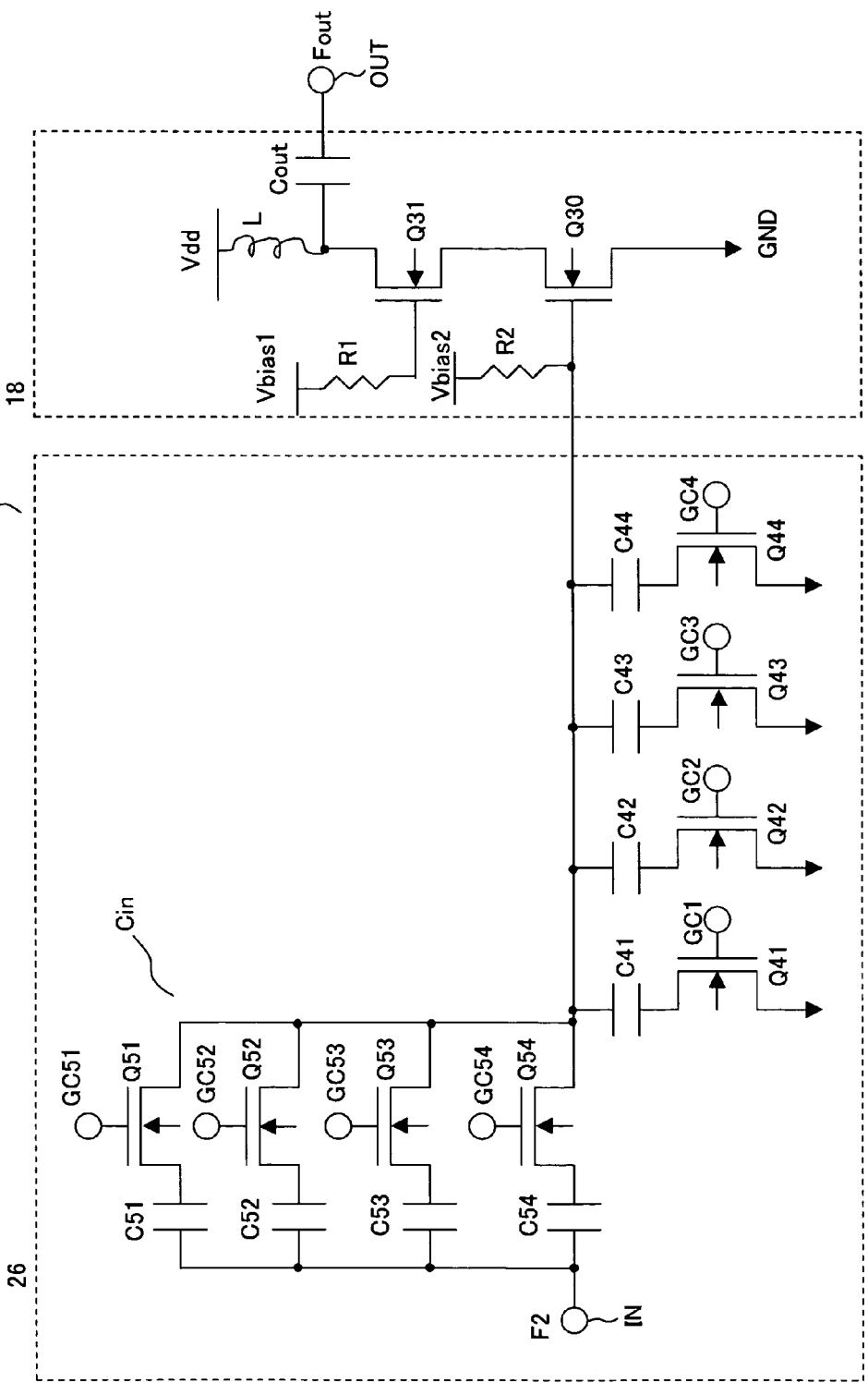
FIG. 5 is a circuit diagram of a second modified example of the amplifier circuit of this embodiment.

FIG. 5 is a circuit diagram of a second modified example of the amplifier circuit of this embodiment. The attenuator 26 of this modified example comprises a plurality of capacitors C51 to C54 and N-channel switch transistors Q51 to Q54 in order to render the input coupling capacitor Cin in the amplifier circuit in FIG. 3 capable of variable control. These transistors are suitably controlled to conduct/not conduct by means of coupling capacitance control signals GC51 to GC54.

By establishing the relationship between the attenuation capacitors C41 to C44 and the input coupling capacitors C51 to C54 as follows, the input impedance from the input terminal IN can be rendered constant and matching can be implemented within a wide frequency band. That is, when the total capacitance value of the attenuation capacitors C41 to C44 is smaller (smaller attenuation), the total capacitance value of the input coupling capacitors C51 to C54 is then larger. Conversely, when the total capacitance value of the attenuation capacitors C41 to C44 is larger (larger attenuation), the total capacitance value of the input coupling capacitors C51 to C54 is then smaller. In addition, for a first frequency band, a first combination of the above capacitors is taken so that the frequency-band matched input impedance is selected, and, for a second frequency band that is higher than the first frequency band, a second combination of the above capacitors is taken so that the frequency-band matched input impedance is selected. In these frequency bands, the attenuation capacitors C41 to C44 and the input coupling capacitors C51 to C54 are taken in the above combinations in accordance with the desired attenuation amount to keep the input impedance constant. Therefore, by variably controlling the input impedance to the optimum value together with the attenuation amount, a wider frequency band can be used.

Depending on the high frequency circuit provided upstream, an inductance element or the like may be added upstream of the attenuator 26 so that a matching circuit constituted by a combination of the inductance element and the capacitors in the attenuator 26 can also be constituted.

Figure 6:
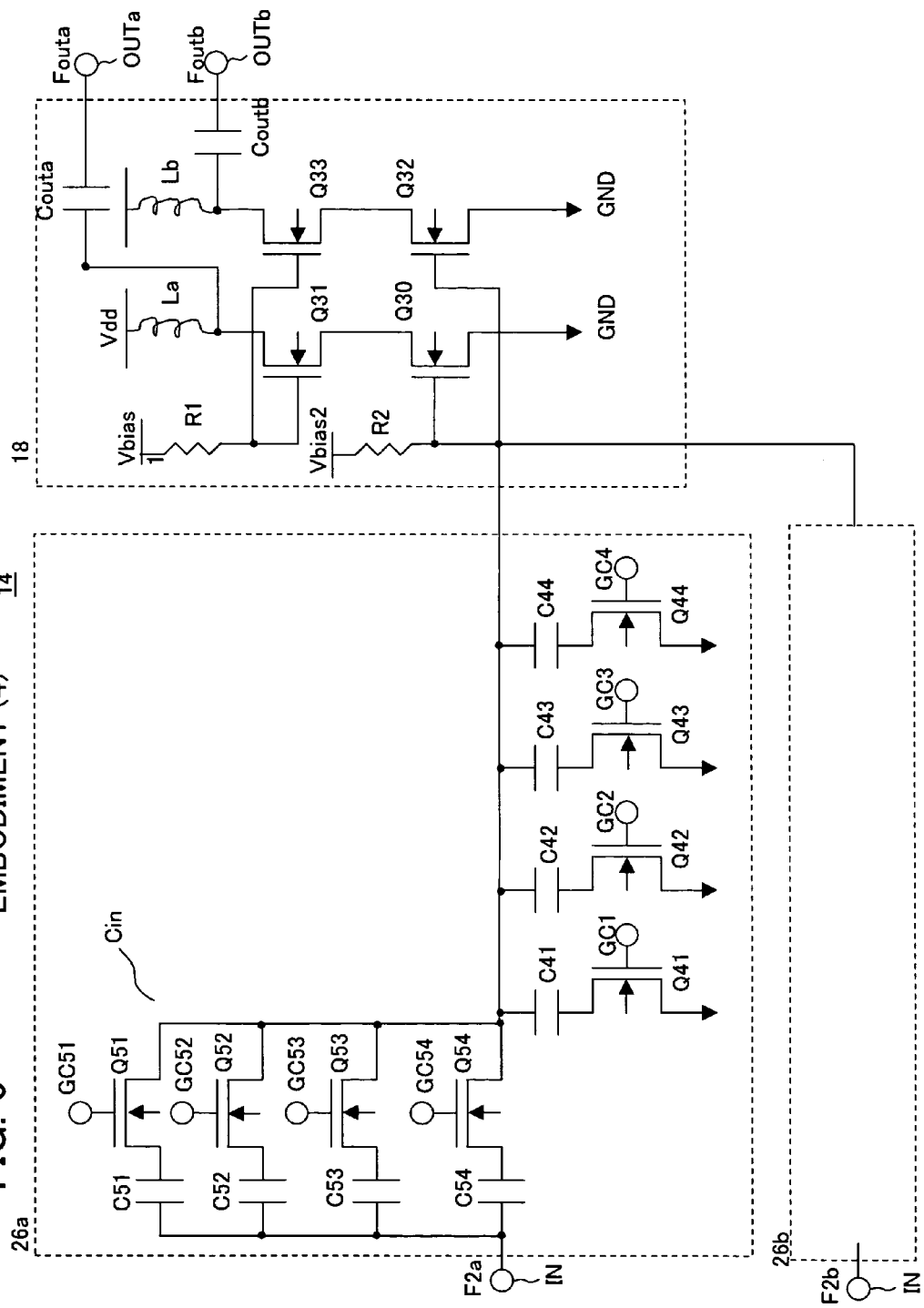
FIG. 6 is a circuit diagram of a third modified example of the amplifier circuit of this embodiment.

FIG. 6 is a circuit diagram of a third modified example of this embodiment. The attenuator 26 in FIG. 5 may be connected to the differential-circuit-type amplifier transistor unit shown in FIG. 4. That is, the constitution is shown in the circuit diagram of FIG. 6. The operation of this differential circuit is the same as that of FIG. 4 and attenuators 26a and 26b are provided for a pair of amplifier transistors Q30, Q32. The constitution of the attenuator is the same as that in FIG. 5.

The capacitance values of each of the capacitors in the attenuator 26 in the modified examples in FIGS. 5 and 6 are as follows, for example:

C41=280 fF, C42=560 fF, C43=1120 fF, C44=2240 fF
C51=280 fF, C52=560 fF, C53=1120 fF, and C54=2240 fF.

In addition, the gate length of the switch transistors is Lg=0.24 μm, for example, and the gate widths are as follows, for example:

Wg of Q41=8 μm, Wg of Q42=16 μm, Wg of Q43=32 μm, and Wg of Q44=64 μm; and

Wg of Q51=8 μm, Wg of Q52=16 μm, Wg of Q53=32 μm, and Wg of Q54=64 μm.

Therefore, by affording the capacitance values of the attenuation capacitors C41 to C44 and the input coupling capacitors C51 to C54 binary relationships, the respective capacitance values can be controlled linearly by means of control signals.

Although a pair of N-channel transistors is cascode-connected in the amplifier transistor unit 18 in the embodiment above, the present invention is not limited to or by such a constitution. A constitution that comprises a single N-channel transistor to whose gate the input signal F2 is supplied could also be implemented.

What is claimed is:

1. An amplifying circuit that performs a variable gain control, the amplifying circuit comprising:
   an input terminal receiving a high frequency input signal;
   a first amplifying transistor having a gate receiving the high frequency input signal and generating an amplified signal at a drain thereof; and
   a variable attenuator providing a signal transmission line between the input terminal and the gate of the first amplifying transistor, the variable attenuator including a plurality of attenuation units provided in parallel between the signal transmission line and a power supply, each of the attenuation units including an attenuation capacitor and a switch transistor connected serially, and an attenuation ratio is variably controlled by the switch transistor.

2. The amplifier circuit according to claim 1, wherein
a capacitance ratio of the plurality of attenuation capacitors includes at least a relationship of 2:4:8:16; and
a ratio of gate widths of the plurality of switch transistors includes a same relationship as the capacitance ratio.

3. The amplifier circuit according to claim 1, wherein:
the variable attenuator comprises an input coupling capacitor provided between the input terminal and the signal transmission line.

4. The amplifier circuit according to claim 1,
wherein the variable attenuator comprises an input coupling capacitor unit provided between the input terminal and the signal transmission line; and
the input coupling capacitor unit includes a plurality of input units provided in parallel, each of the input units including an input coupling capacitor and an input switch transistor connected serially, and an input coupling capacitance is variably controlled by the input switch transistor.

5. The amplifier circuit according to claim 4,
wherein a capacitance ratio of the plurality of input coupling capacitors includes at least a relationship of 2:4:8:16; and
a ratio of widths of gates of the plurality of input switch transistors includes a same relationship as the capacitance ratio.

6. The amplifier circuit according to claim 1, further comprising:
a second amplifying transistor that is connected to the drain of the first amplifying transistor and having a gate connected to a predetermined bias voltage,
wherein an amplified output signal is generated at a drain of the second amplifying transistor.

7. The amplifier circuit according to claim 1, wherein:
a pair of cascode-connected structures, each including the connected first and second amplifying transistors, are connected in parallel,
a differential circuit is formed by the pair of cascode connected structures, and
a differential signal is input to the differential circuit, and an amplified differential signal is output by the differential circuit.

8. The amplifier circuit according to claim 1, further comprising:
an inductance element provided upstream of the input terminal and constituting a matching circuit together with the attenuation capacitors.

9. A variable attenuator for attenuating a high frequency input signal, the variable attenuator comprising:
an input terminal receiving the high frequency input signal;
an output terminal that outputs a high frequency output signal; and
a plurality of attenuation units provided in parallel, each of the attenuation units connected to a signal transmission line between the input and output terminals and having a capacitor and a switch transistor connected serially between the signal transmission line and a power supply, wherein
an attenuation ratio is variably controlled by the switch transistor.

10. The variable attenuator according to claim 9, wherein
a capacitance ratio of the plurality of attenuation capacitors includes at least a relationship of 2:4:8:16; and
a ratio of gate widths of the plurality of switch transistors includes a same relationship as the capacitance ratio.

11. The variable attenuator according to claim 9, further comprising:
an input coupling capacitor provided between the input terminal and the signal transmission line.

12. The variable attenuator according to claim 9, further comprising:
an input coupling capacitor unit provided between the input terminal and the signal transmission line,
the input coupling capacitor unit including a plurality of input units provided in parallel, each of the input units including an input coupling capacitor and an input switch transistor connected serially, and an input coupling capacitance is variably controlled by the input switch transistor.

13. The variable attenuator according to claim 12, wherein
a capacitance ratio of the plurality of input coupling capacitors includes at least a relationship of 2:4:8:16; and
a ratio of gate widths of the plurality of input switch transistors includes a same relationship as the capacitance ratio.

* * * * *